(12) United States Patent
del Puerto et al.

(10) Patent No.: US 6,826,451 B2
(45) Date of Patent: Nov. 30, 2004

(54) LITHOGRAPHY TOOL HAVING A VACUUM RETICLE LIBRARY COUPLED TO A VACUUM CHAMBER

(75) Inventors: Santiago del Puerto, Milton, NY (US); Markus F. A. Eurlings, Tilburg (NL)

(73) Assignee: ASML Holding N.V., Veldhoven (NL)

(*) Notice: Subject to any disclaimer, the term of this patent is extended or adjusted under 35 U.S.C. 154(b) by 116 days.

(21) Appl. No.: 10/225,343

(22) Filed: Aug. 22, 2002

(65) Prior Publication Data

US 2004/0019408 A1 Jan. 29, 2004

Related U.S. Application Data

(63) Continuation-in-part of application No. 10/206,400, filed on Jul. 29, 2002, now abandoned.

(51) Int. Cl.[7] ............................................. G06F 19/00
(52) U.S. Cl. ...................... 700/245; 700/246; 700/250; 700/257; 414/217
(58) Field of Search ................................. 700/245, 246, 700/250, 257; 355/132; 414/217; 716/21

(56) References Cited

U.S. PATENT DOCUMENTS

| | | | | |
|---|---|---|---|---|
| 4,536,458 A | * | 8/1985 | Ng ................................ | 430/41 |
| 4,563,085 A | * | 1/1986 | Ternes ......................... | 355/132 |
| 4,776,745 A | * | 10/1988 | Foley ........................... | 414/217 |
| 6,239,863 B1 | | 5/2001 | Catey et al. | |
| 6,404,483 B1 | | 6/2002 | Segers et al. | |
| 2002/0102564 A1 | * | 8/2002 | Mittmann et al. .............. | 435/6 |
| 2002/0167649 A1 | * | 11/2002 | Heinle ........................... | 355/53 |
| 2002/0188417 A1 | * | 12/2002 | Levy et al. ................... | 702/155 |
| 2003/0211409 A1 | * | 11/2003 | Nunes ........................... | 430/22 |

FOREIGN PATENT DOCUMENTS

| | | |
|---|---|---|
| EP | 1052549 A2 | 11/2000 |
| EP | 1052551 A2 | 11/2000 |
| EP | 1211562 A1 | 6/2002 |
| EP | 1318430 A2 | 6/2003 |

OTHER PUBLICATIONS

Sugiyama et al., Advanced electron–beam lithography—Software system AMDES, 1980, IEEE, 531–539.*
Tkisue et al., Development of non–contact handling system for semiconductor wafers, 1989, IEEE, pp. 246–249.*
Mishima et al., Desorption characteristics of isopropanor (IPA) and moisture frim IPA vapor dried silicon wafers, 1989, IEEE, pp. 121–129.*
Siniaguine, Atmospheric downstream plasma etching of Si wafers, 1998, IEEE, pp. 139–145.*
Jimbo et al., Thermal desorption behavior of adsorbed materials on wafer surfaces, 1997, IEEE, pp. E–5 to E–8.*
English–language Patent Abstract of JP 2000228354 A, published Aug. 15, 2000, 1 page.
Copy of European Search Report for Singapore Appln. 200303900–5 mailed Feb. 26, 2004.

* cited by examiner

Primary Examiner—Thomas G. Black
Assistant Examiner—McDieunel Marc
(74) Attorney, Agent, or Firm—Sterne, Kessler, Goldstein & Fox P.L.L.C

(57) ABSTRACT

A lithography tool includes an exposure chamber and a reticle handler that exchanges a reticle being exposed as prescribed by the user of the lithography tool. The reticle handler can include a vacuum-compatible robot, a vacuum chamber to house the robot, a load-lock to input reticles and transition them from atmospheric pressure to vacuum, a processing station for processing the reticle, and a reticle library for storing at least one extra reticle so that it is quickly available for exchange during an exposure process. The robot can have a two or more handed gripper to simultaneously hold multiple reticles. This allows a first reticle to be removed from the reticle stage with a first hand and a second reticle to be loaded onto the reticle stage with a second hand, and so on, which minimizes exchange time.

48 Claims, 9 Drawing Sheets

LITHOGRAPHY TOOL HAVING A VACUUM RETICLE LIBRARY COUPLED TO A VACUUM CHAMBER

CROSS-REFERENCE TO RELATED APPLICATIONS

This application is a continuation-in-part of U.S. application Ser. No. 10/206,400 filed Jul. 29, 2002 (now abandoned), which is incorporated by reference herein in its entirety.

BACKGROUND OF THE INVENTION

1. Field of the Invention

The present invention is related to a lithographic tool that increases multiple exposure throughput in ultra violet environments by switching multiple reticles during exposure.

2. Background Art

Lithography tools have been developed to allow smaller and smaller devices to be patterned on a wafer. Lithographic tools and methods are being developed that utilize multiple exposure. During multiple exposure, two or more reticles are imaged sequentially based on reticle swapping between imaging. Multiple exposure is particularly advantageous in extreme ultra violet (EUV) imaging to overcome undesirably low k1 imaging effects. In existing systems, the reticle swap time heavily impacts throughput because each reticle to be swapped must be transferred from ambient pressure to vacuum just before exposure. Unfortunately, there are no existing lithographic tools that perform multiple exposures and efficiently house multiple reticles at vacuum.

Therefore, what is needed is vacuum storage for holding two or more reticles, such that the vacuum storage is coupled to a vacuum chamber. This configuration would allow for fast reticle swap during multiple exposures, and hence throughput improvement.

BRIEF SUMMARY OF THE INVENTION

Embodiments of the present invention provide a method including the steps of processing reticles in a vacuum processing section received from a vacuum input section, storing the reticles in a vacuum library, storing data correlating information generated during the processing step and a location of each one of the reticles stored in the vacuum library, and retrieving a requested reticle to be used for exposing a pattern on a wafer from the vacuum library based on the storing data step.

Other embodiments of the present invention provide a method comprising the steps of providing a central vacuum section having a robot. The method also includes the steps of coupling a vacuum input section to the central vacuum section, the vacuum input section receiving reticles before they are brought into the central vacuum section by the robot. The method also includes the steps of coupling a first vacuum holding section to the central vacuum section. The first vacuum holding section receives one reticle at a time from the robot. The method also includes coupling a second vacuum holding section to the central vacuum section via a valve. The second vacuum holding section simultaneously holding a predetermined amount of the reticles received through the valve from the robot. The method also includes coupling an exposure section to the central vacuum section. The exposure chamber receives reticles transported from one of the first or second vacuum holding section via the robot.

Still further embodiments of the present invention include a system including a central vacuum section and a robot positioned in the central vacuum section. The system also includes a pressure controlled input section that receives reticles before they are brought into the central vacuum section by the robot, a first holding section that holds one of the reticles at a time received from the robot, and a second holding section coupled to the central vacuum section that simultaneously holds a predetermined amount of the reticles received from the robot. The system also includes an exposure section that receives the reticles from the robot.

Still further embodiments of the present invention provide a method including the steps of indexing reticles before transferring the reticles to a vacuum input section, processing the reticles in a vacuum processing section that are received from the vacuum input section, storing the reticles in a vacuum library, indexing said stored reticles, and retrieving a requested reticle to be used for exposing a pattern on a wafer from the vacuum library based on said indexing steps.

Through the above embodiments, reticle swap time during multiple exposure is substantially reduced by having a plurality of reticles stored within the lithography tool at vacuum. This, in turn, decreases the costs of manufacturing semiconductors and solves imaging problems that occur in EUV environments.

Further embodiments, features, and advantages of the present inventions, as well as the structure and operation of the various embodiments of the present invention, are described in detail below with reference to the accompanying drawings.

BRIEF DESCRIPTION OF THE DRAWINGS/ FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1A, 1B, and 1C shows stages of components in a lithography tool according to embodiments of the present invention.

FIG. 2 is a flowchart depicting a method of switching reticles during exposure according to embodiments of the present invention.

FIGS. 3A, 3B, and 3C show views of a multiple reticle holding device in a lithography tool according to embodiments of the present invention.

Figure 1A:
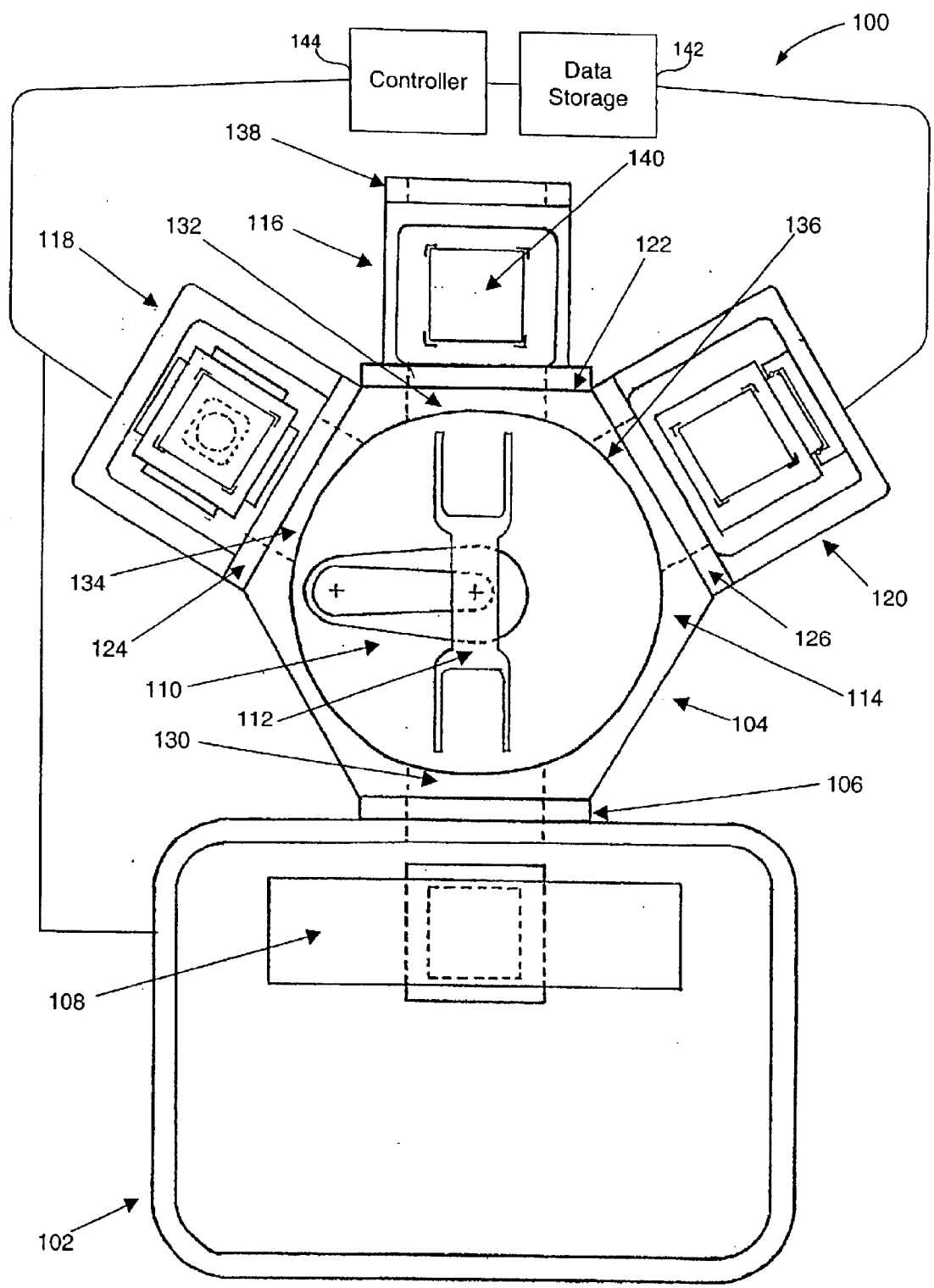

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Generally, a lithography tool 100 according to embodiments of the present invention can include an exposure chamber 102 with one or more mirrors (not shown) that project EUV light through a reticle mounted on a reticle stage 108 to a wafer (not shown) to print multiple copies of a layer of an integrated circuit on the wafer. Lithography tool 100 can also include a reticle handler 104 that exchanges the reticle being exposed as prescribed by the user of the lithography tool 100. Existing lithography tools that transport reticles for exposure are taught in U.S. Pat. No. 6,239,863 to Catey et al., U.S. application Ser. No. 09/925,722 to DeMarco et al., U.S. application Ser. No. 10/040,375 to Friedman et al., U.S. Prov. App. No. 60/358,354 to del Puerto et al., and U.S. Prov. App. No. 60/364,129 to del Puerto et al., which are all incorporated herein by reference in their entirety.

Specifically, the reticle handler according to embodiments of the present invention can include a vacuum-compatible robot 110, a vacuum chamber 114 (e.g., a central or main vacuum section) to house the robot 110, a pressure controlled input section (e.g., a load-lock) 116 to identify (or index) and input reticles and transition them from atmospheric pressure to vacuum, a first holding section (e.g., a processing station or section) 118 for identifying the reticle, inspecting the reticle, measuring the reticle's thickness, cleaning the reticle, and/or aligning the reticle relative to the lithography tool 100, and a second holding section (e.g., a reticle library) 120 for storing at least one extra reticle, such that the reticle is quickly available for exchange. Also, based on information gathered at input section 116, processing section 118 and/or the location of the reticle in reticle library 120, the stored reticle can be indexed to aid in retrieving the reticles during exposure. The robot 110 can have a one or more handed gripper 112 that can simultaneously hold one or more reticles. This allows a first reticle to be removed from the reticle stage 108 with a first hand and a second reticle to be loaded onto the reticle stage 108 with a second hand, and so on, which minimizes exchange time. Although discussed above and below as having one load lock, one processing section, and one exposure section, there can be as many of these elements as required.

Figure 1B:
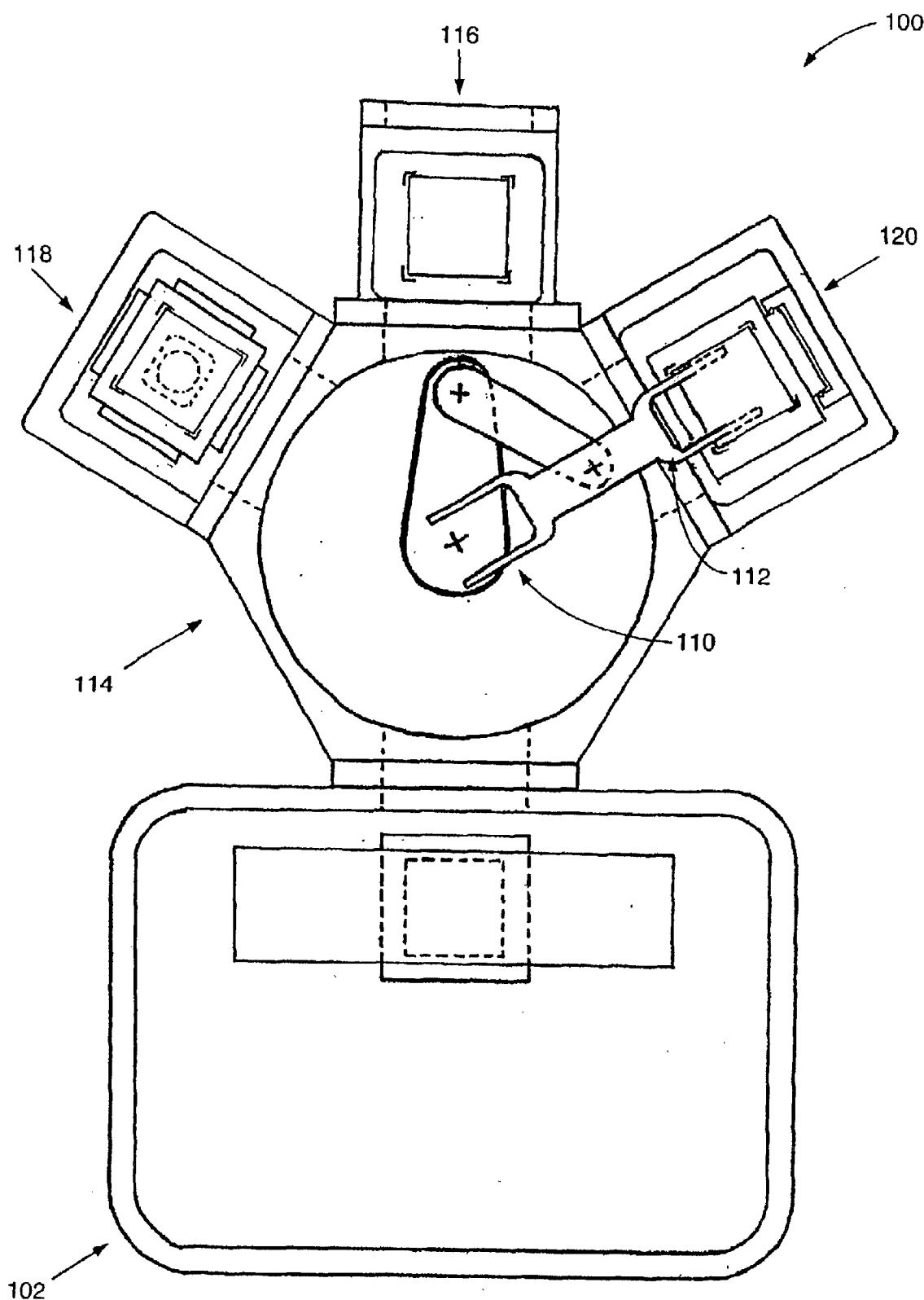
Figure 1C:
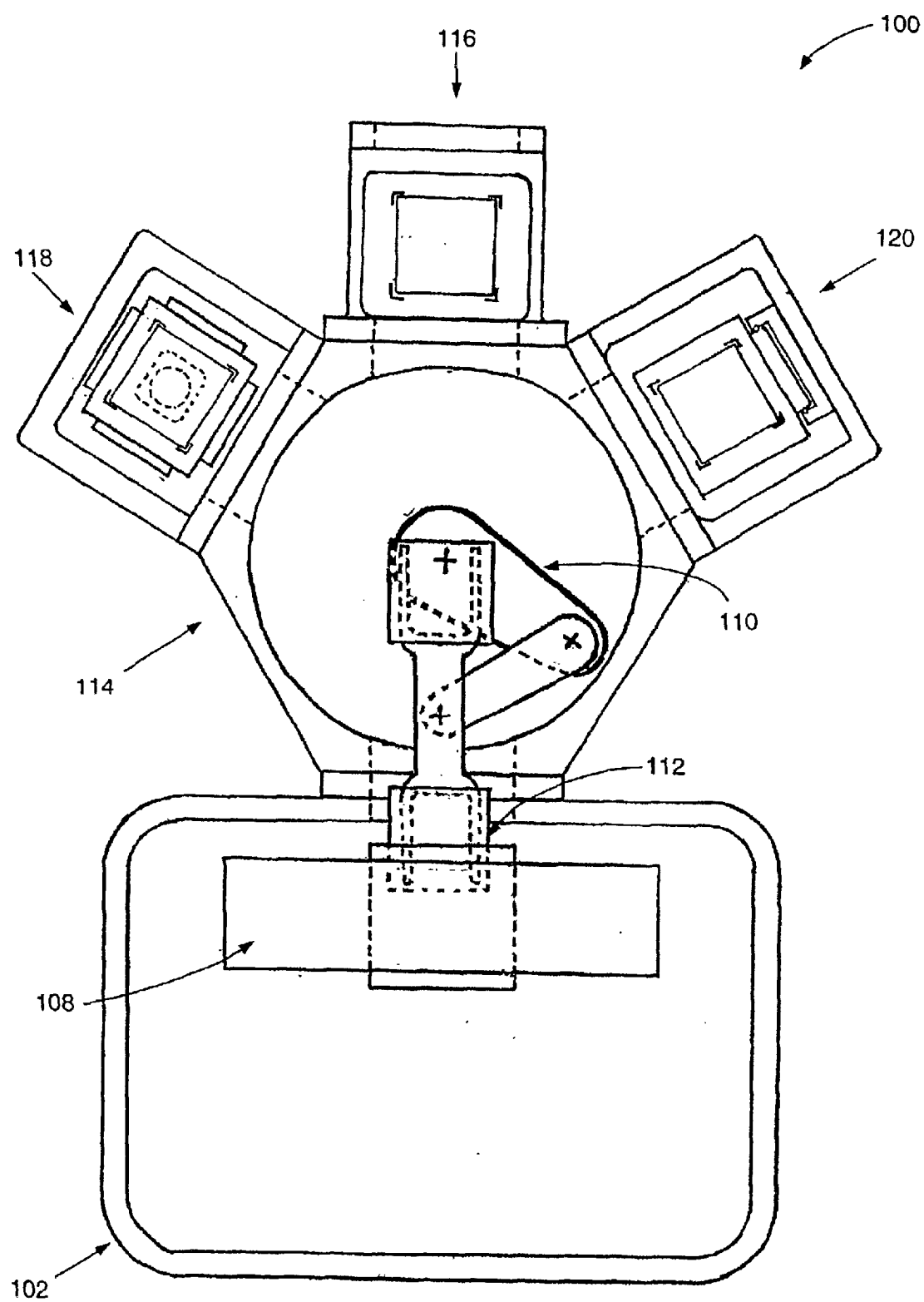

FIGS. 1A–C are sectional views looking into a lithography tool 100 from the top according to embodiments of the present invention. Only FIG. 1A is fully labeled with element numbers because FIGS. 1B and 1C only show different positions of a robot arm 110 during operation of lithography tool 100. Lithography tool 100 includes an exposure section (e.g. exposure chamber with one or more mirrors) 102 and reticle handler 104, which is coupled to exposure chamber 102 via a gate valve 106. A reticle stage 108 is located inside exposure chamber 102 and can hold a reticle that is being exposed near the location depicted as a dashed-line square.

With continuing reference to FIGS. 1A–C, reticle handler 102 includes a vacuum-compatible robot 110, which is shown as being equipped with two-handed gripper 112. In alternative embodiments, the gripper 112 can have as many hands as required. The robot 110 is located inside central vacuum chamber 114. Load-lock 116, processing station 118, and reticle library 120 are coupled to central chamber 114 via gate valves 122, 124, and 126, respectively. Load-lock 116 can include an identification device for identifying a reticle, as is known in the art. Processing station 118 can include: (1) an aligning device that can have a sensor (e.g., a camera, a reflective optical sensor, a through beam optical sensor, or the like), (2) an identification device (e.g., a camera, a bar code reader, or the like), (3) a reticle cleaning device, and/or (4) an inspection device (e.g., a measuring device, a camera, or the like) to measure thickness, read a bar code label on the reticle, or the like, as is known in the art. Mail-slot-like openings (e.g., passages) 130, 132, 134, and 136, respectively, represented by spaces between pairs of parallel dashed lines in walls of central chamber 114, allow robot 110 to pass reticles from one area of the tool 100 to another. Passage 130 connects exposure chamber 102 to central chamber 114. Passage 132 connects load-lock 116 to central chamber 114. Passage 134 connects processing station 118 to central chamber 114. Passage 136 connects reticle library 120 to central chamber 114. Each passage 130, 132, 134, and/or 136 can be closed and/or sealed off by closing its associated gate valve 106, 122, 124, and 126.

Again, with reference to FIGS. 1A–C, load-lock 116 further includes door valve 138. Through the use of gate valve 122 and door valve 138, load-lock 116 controls the pressure of reticles passed through it. Initially, gate valve 122 is closed and door valve 138 is open, thus enabling a reticle 140 to be removed from or placed in load-lock 116 through door valve 138. After placing reticle 140 in load-lock 116, door valve 138 is closed, load-lock 116 is pumped down, and gate valve 122 is opened. This allows robot 110 to reach reticle 140 through passage 132 and remove reticle 140 from load-lock 116. Reticle 140 is then processed in processing station 118, which is described in more detail below. After removing reticle 140 from processing station 118, robot 110 can store reticle 140 in reticle library 120 through slot 136, as shown in FIG. 1B. Data collected at the processing station 118 and information identifying the location of reticle 140 in reticle library 120 can be correlated and stored in data storage 142. Controller 144 accesses the stored data in data storage 142 when robot 110 is directed to retrieve requested reticles during an exposure process. Thus, through the system as described, there is a reticle library 120 located within the lithography tool 100 that holds multiple reticles at vacuum to allow for substantially faster reticle swap. Also, based on the correlated data in data storage 142 the lithography tool 100, the stored reticles can be indexed to increase the speed and accuracy in retrieving a requested reticle.

Figure 2:
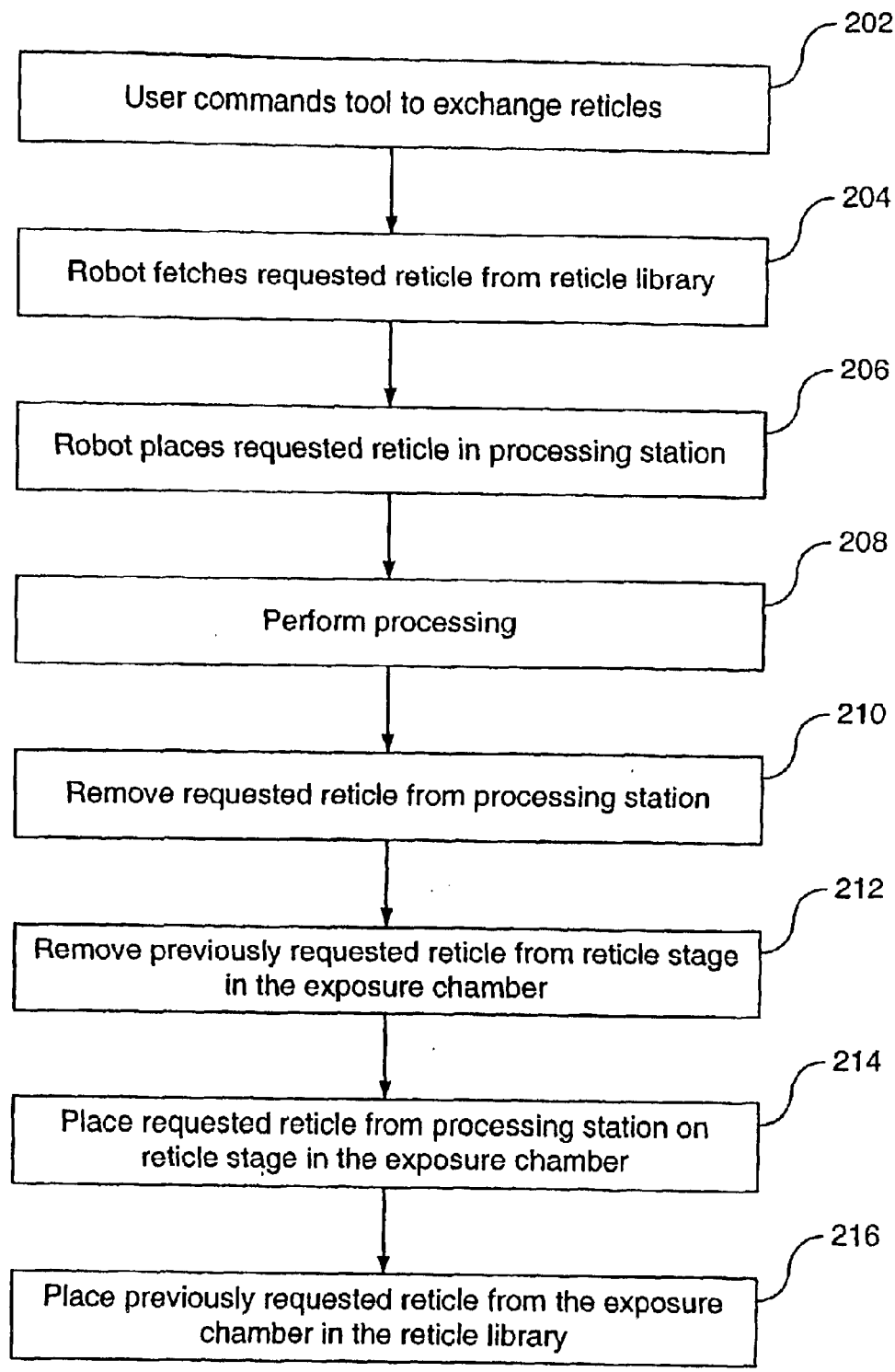

FIG. 2 shows a method 200 for exchanging reticles according to embodiments of the present invention (steps 202–216). At step 202, a user commands tool 100 to exchange reticles. At step 204, robot 110 fetches the requested reticle from reticle library 120 (FIG. 1B). At step 206, robot 110 places the requested reticle in processing station 118. At step 208, processing is performed. Processing can include a coarse or rough alignment on a mechanical stage or other rough alignment device in processing station 118. The mechanical stage has at least one degree of freedom selected from the group of X, Y, or Z translations and rotation about a Z-axis. The Z-axis is defined as being perpendicular to major faces or sides of the requested reticle. At step 210, robot 110 removes the requested reticle from processing station 118 with a first hand. At step 212, robot 110 removes a reticle that is currently on stage 108 with a second hand. At step 214, robot 110 places the requested reticle on stage 108 (FIG. 1C). At step 216, robot 110 places the reticle that was previously on stage 108 in reticle library 120 (FIG. 1B).

Existing vacuum systems have certain limitations: 1) commercially available vacuum-compatible robots tend to have very limited vertical travel; 2) commercial slot valves have openings that are very narrow in height; and 3) because of 1 and 2, the working volume accessible by a robot in a typical vacuum application is a very short and broad cylinder, for example, about 25 millimeters (mm) tall by 2,000 mm in diameter. Thus, according to embodiments of the present invention shown in FIGS. 3A–C, to increase the storage capacity, a reticle library 120 is implemented with a vertical indexer module 300. This increases the storage capacity of library 120 so that it can hold more than one reticle.

Figure 3A:
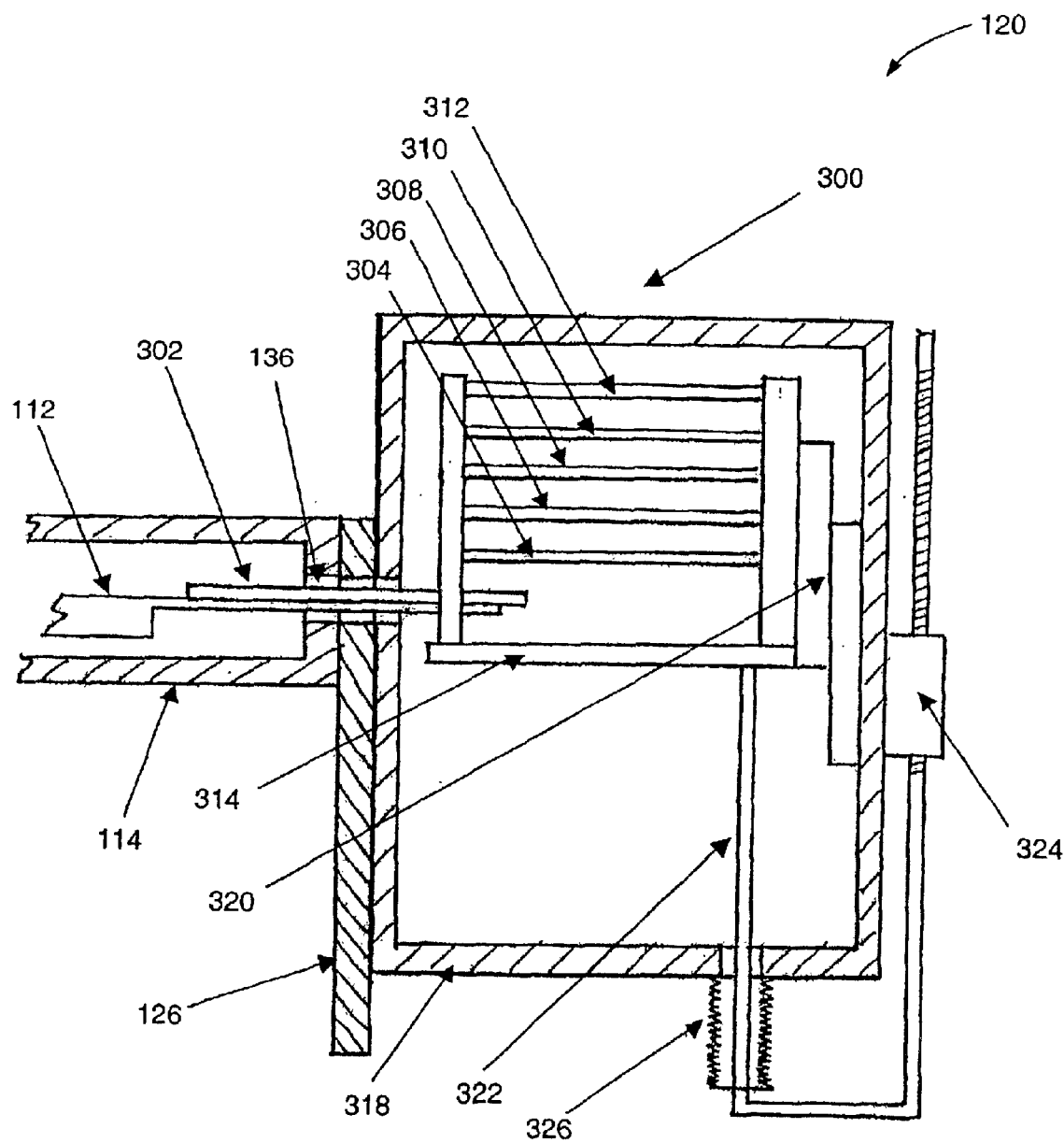
Figure 3B:
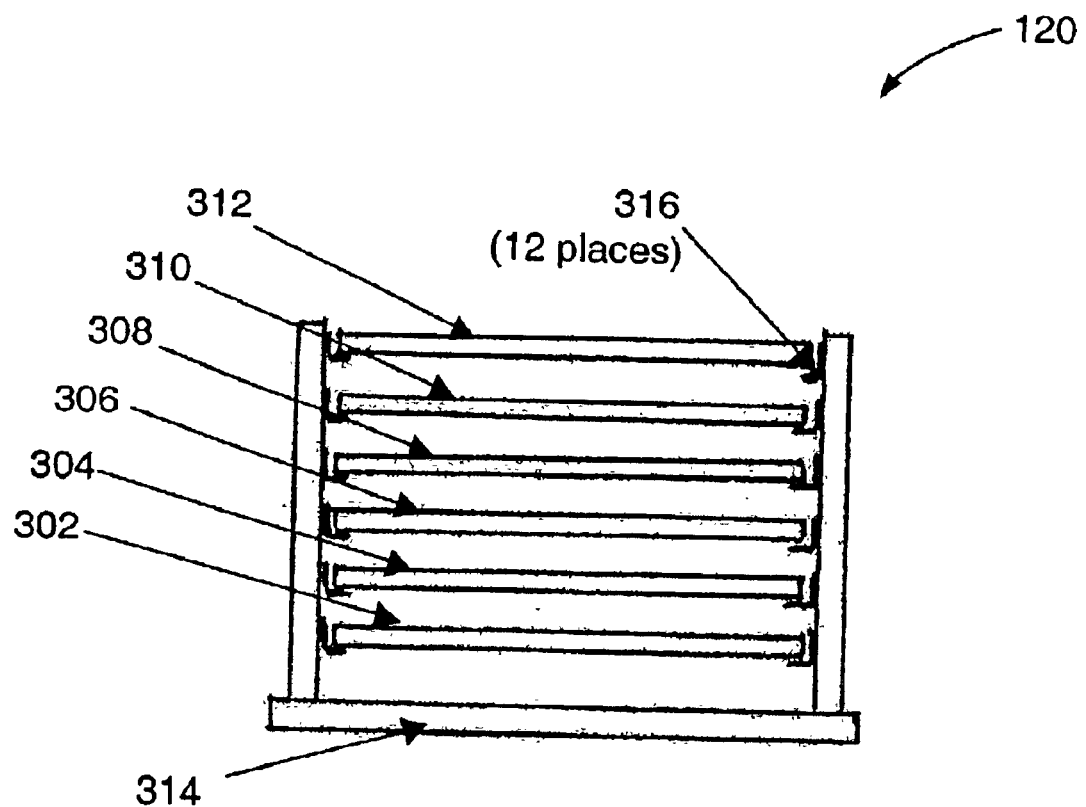
Figure 3C:
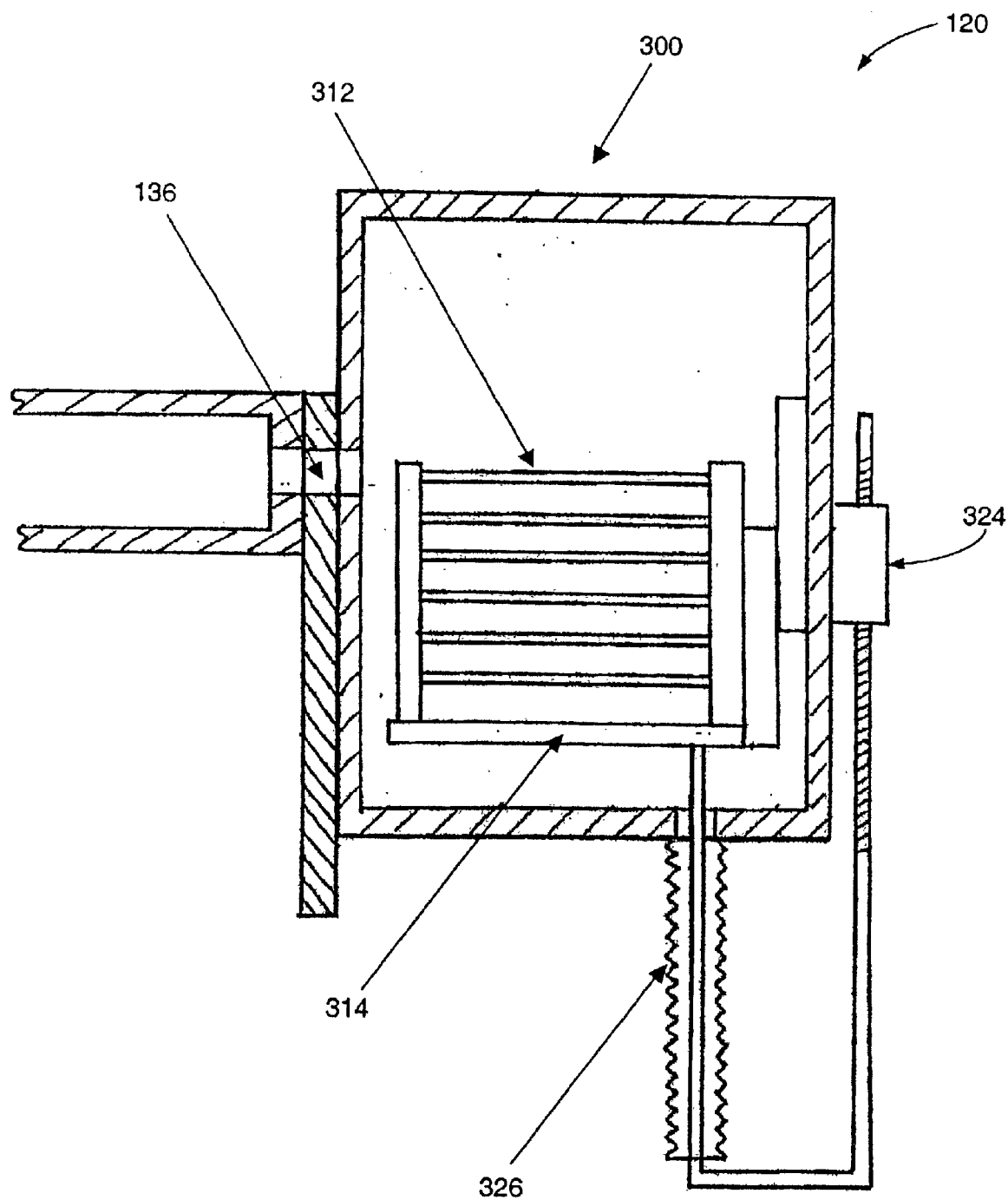

FIGS. 3A–3C show side cross-sectional views of an indexer module 300 according to embodiments of the present invention. Indexer module 300 is part of reticle library 120 and is coupled via gate valve 126 to central vacuum chamber 114. Gripper 112 is shown transporting reticle 302 from indexer module 300 to central vacuum chamber 114 via passage 136. Other reticles 304–312 are shown as being stored inside indexer module 300. Rack 314 supports reticles 304–312.

Referring to FIG. 3B, which shows a side view of rack 314, (as seen from the approach direction of robot 110), each reticle 302–312 is supported by brackets 316, which allow removal of reticles 302–312 in the direction perpendicular to this view.

Referring again to FIG. 3A, rack 314 is coupled to library vacuum enclosure 318 via slide 320. Rack 314 is raised or lowered relative to the enclosure 318 by the action of push rod 322, which is powered by ball screw drive 324. Raising or lowering rack 314 can line up any of the reticles 302–312 to passage 136. This allows for easy insertion or extraction of the reticles 302–312 from reticle library 120 by robot 110. Comparing FIGS. 3A and 3C, rack 314 is at an upper limit of its travel in FIG. 3A, corresponding to the bottom reticle slot that holds reticle 302 being lined up to passage 136 making reticle 302 accessible by robot 110. In contrast, in FIG. 3C rack 314 is at a lower limit of its travel, which corresponds to the top reticle slot that holds reticle 312 being lined up to passage 136 making the reticle 312 accessible by robot 110. Bellow 326 is attached at one end to vacuum enclosure 318 and at an opposite end to push rod 322. Bellow 326 is used to maintain the vacuum seal, while accommodating the motion of the push rod 322. Bellow 326 is shown in its most contracted position in FIG. 3A and in its most extended position in FIG. 3C.

Figure 4:
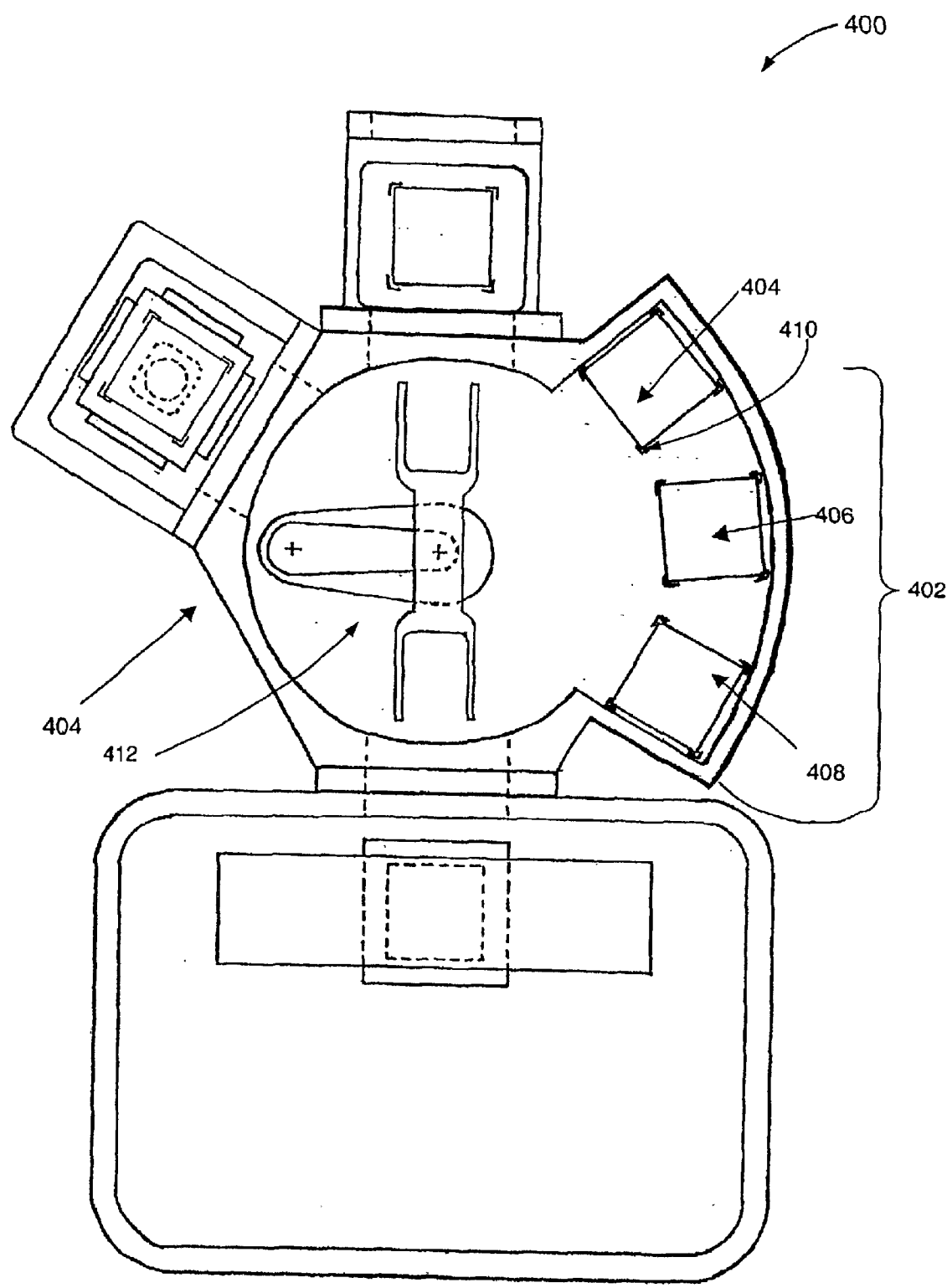
FIG. 4 shows a multiple reticle holding device in a lithography tool according to embodiments of the present invention.

FIG. 4 shows a lithography tool 400 including an in-vacuum library 402 according to embodiments of the present invention. Central vacuum chamber 404 has been extended to incorporate library area 402. Reticle positions 404, 406, and 408 in library area 402 and have support devices 410 (e.g., brackets) to hold stored reticles. In some embodiments, reticles are only about 6 mm thick, but the typical vertical motion range of a vacuum robot 412 is in the order of 25 mm or slightly more. Thus, the vertical motion range of robot 412 is greater than the thickness of one reticle. Accordingly, in alternative embodiments, more than one reticle can be vertically stacked in each of reticle positions 404, 406, and/or 408. This increases the capacity of library 402. A rack (not shown) similar to rack 408 in FIG. 3B, but shorter (e.g., two levels tall) could be used to support the reticles.

Figure 5:
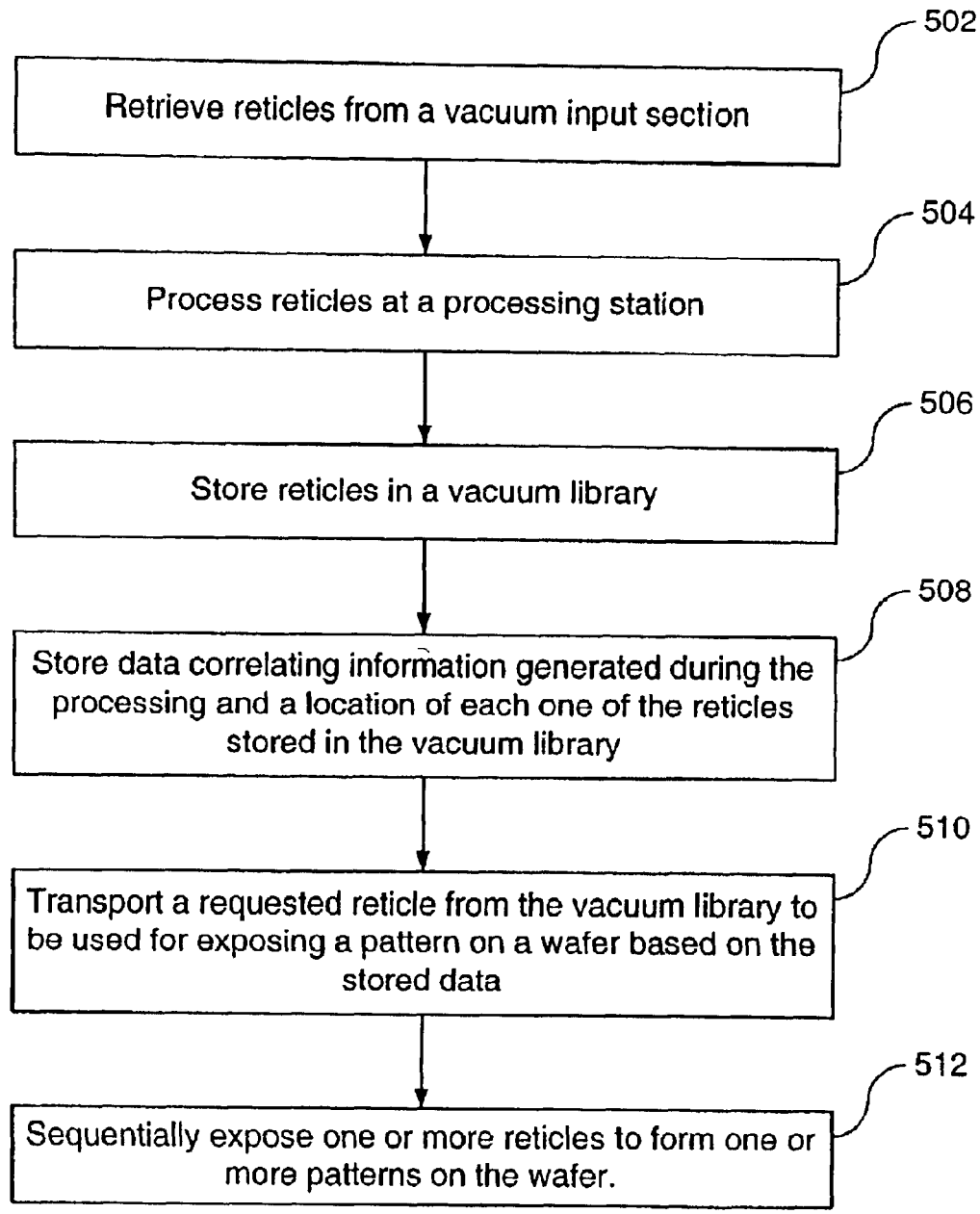
FIG. 5 is a flowchart depicting a method according to embodiments of the present invention.

FIG. 5 illustrates a method 500 according to embodiments of the present invention (steps 502–512). At step 502, reticles are retrieved from a vacuum input section (e.g., section 116) that transitions the reticles from atmospheric pressure to vacuum. Additionally, at before or at step 502, the reticle can be identified or indexed. At step 504, a processing section (e.g., section 118) processes reticles, which is described in more detail below. At step 506, the reticles are stored in a vacuum library (e.g., library 120 or library 402). At step 508, data is stored (e.g., in data storage 142). The data is representative of a correlation between information generated during processing step 504 and/or identification information generated before or during step 502 and information identifying a location of each one of the reticles stored in the vacuum library. At step 510, a requested reticle is transported from the vacuum library to an exposure chamber (e.g., chamber 102) based on the stored data (e.g., under control of controller 144). In other embodiments, during transporting step 510 a robot (e.g., robot 110 or robot 412) with multiple holding devices (e.g., holding devices 112) can be used to transport more than one requested reticle to allow for sequential exposure of more than one pattern on the wafer. In still further embodiments, step 510 can include pre-aligning the requested reticle at the processing section before delivering the reticle to the exposure chamber. At step 512, one or more reticles are sequentially exposed on a reticle stage (e.g., stage 108) in the exposure chamber to form one or more patterns on the wafer.

In various embodiments, the processing step 504 can include one or more processes. A first process can be identifying each one of the reticles. The identifying can be accomplished with a camera, a bar code reader, or the like. Another process can be inspecting each one of the reticles with an appropriate inspection device. A further process can be measuring a thickness of each one of the reticles. A still further process can be rough-aligning the reticles with respect to a lithography tool. A still further process can be cleaning the reticles. Accordingly, the data stored in step 508 is partially based on one or more of these processes.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method comprising the steps of:
   processing reticles in a vacuum processing section received from a vacuum input section;
   storing the reticles in a vacuum library;
   indexing the stored reticles; and
   retrieving a requested reticle to be used for exposing a pattern on a wafer from the vacuum library based on said indexing step.

2. The method of claim 1, wherein said processing step comprises the step of identifying each one of the reticles and wherein data stored in said indexing step includes an identification determined in said identifying step.

3. The method of claim 1, wherein said processing step comprises the step of inspecting each one of the reticles and wherein data stored during said indexing step includes inspection information determined in said inspection step.

4. The method of claim 1, wherein said processing step comprises the step of measuring a thickness of each one of the reticles and wherein data stored during said indexing step includes said thickness determined in said measuring step.

5. The method of claim 1, wherein said processing step comprises the step of cleaning the reticle.

6. The method of claim 1, wherein said processing step comprises the step of rough-aligning the reticles with respect to a lithography tool.

7. The method of claim 1, wherein said processing step comprises at least one of identifying, inspecting, measuring a thickness, cleaning, and rough-aligning each one of the reticles.

8. The method of claim 1, wherein said retrieving step comprises using a robot with multiple holding devices to retrieve the requested reticle.

9. The method of claim 8, wherein during said retrieving step more than one requested reticle is retrieved by the robot with the multiple holding devices to allow for exposure of more than one pattern on the wafer.

10. The method of claim 1, further comprising the step of transitioning the reticles from atmospheric pressure to vacuum in said input section.

11. The method of claim 1, further comprising the step of pre-aligning the requested reticle before performing said exposing.

12. The method of claim 1, wherein said indexing step comprises the step of storing data correlating information generated during said processing step and a location of each one of the reticles stored in the vacuum library.

13. The method of claim 1, further including the step of processing the reticle using the vacuum input section, wherein said indexing step is partially based on said processing using the vacuum input section step.

14. A method comprising the steps of:
providing a vacuum section having a robot;
coupling a vacuum input section to the vacuum section, the vacuum input section receiving reticles before they are brought into the vacuum section by the robot;
coupling a first vacuum holding section to the vacuum section, the first vacuum holding section receiving one of the reticles at a time from the robot;
coupling a second vacuum holding section to the vacuum section, the second vacuum holding section simultaneously holding a predetermined amount of the reticles received from the robot; and
coupling an exposure section to the vacuum section, the exposure section receiving the reticles transported from one of the first or second vacuum holding section via the robot.

15. The method of claim 14, further comprising the step of simultaneously holding a plurality of the reticles with the robot for said transport from the second vacuum holding section to the exposure section.

16. The method of claim 15, further comprising the step of sequentially exposing a wafer in the exposure section with the plurality of reticles transported by the robot.

17. The method of claim 14, further comprising the step of rough-aligning the reticle in the first vacuum holding section.

18. The method of claim 14, further comprising the step of capturing information about the reticle in the first vacuum holding section.

19. The method of claim 18, wherein said capturing step is performed with a bar code reader.

20. The method of claim 18, wherein said capturing step is performed with a camera.

21. The method of claim 14, further comprising the step of capturing information about the reticle using the vacuum input section.

22. A system comprising:
a main vacuum section;
a robot positioned in said main vacuum section;
a pressure controlled input section that receives reticles before they are brought into said main vacuum section by said robot;
a first holding section that holds one of said reticles at a time received from said robot;
a second holding section coupled to said main vacuum section that simultaneously holds a predetermined amount of said reticles received from said robot; and
an exposure section that receives said reticles from said robot.

23. The system of claim 22, wherein said robot has a plurality of holding devices to hold a plurality of reticles at one time for transport from said second holding section to said exposure section.

24. The system of claim 22, wherein said pressure controlled input section comprises a load lock device that has a predetermined pressure.

25. The system of claim 22, wherein said first holding section comprises a device to rough-align said reticle.

26. The system of claim 25, wherein said rough aligning device comprises a mechanical stage having at least one degree of freedom from the group consisting of X, Y, and Z translations and rotation about a Z axis.

27. The system of claim 25, wherein said rough aligning device comprises a sensor.

28. The system of claim 27, wherein said sensor is a camera.

29. The system of claim 27, wherein said sensor is a reflective optical device.

30. The system of claim 27, wherein said sensor is a through beam optical sensor.

31. The system of claim 22, wherein said first holding section comprises an information capturing device to capture information about said reticle.

32. The system of claim 31, wherein said information capturing device is a bar code reader.

33. The system of claim 31, wherein said information capturing device is a camera.

34. The system of claim 22, wherein said second holding section comprises a rack with a plurality of holding devices to hold said plurality of reticles.

35. The system of claim 34, wherein said rack is moveable and indexable to different predetermined ones of said reticles for access by said robot.

36. The system of claim 22, wherein said pressure controlled input section comprises an information capturing device to capture information about said reticle.

37. A method comprising the steps of:
processing reticles during transferring the reticles through a vacuum input section;
processing the reticles in a vacuum processing section that are received from the vacuum input section;
storing the reticles in a vacuum library;
indexing said stored reticles based on said processing steps; and
retrieving a requested reticle to be used for exposing a pattern on a wafer from the vacuum library based on said indexing steps.

38. The method of claim 37, wherein at least one of said processing steps comprises the step of identifying each one of the reticles and wherein data stored during said indexing step includes an identification determined in the at least one of said processing steps.

39. The method of claim 37, wherein said processing step in the vacuum processing section comprises the step of inspecting each one of the reticles and wherein data stored during said indexing said stored reticles step includes inspection information determined in said inspection step.

40. The method of claim 37, wherein said processing step in the vacuum processing section comprises the step of measuring a thickness of each one of the reticles and wherein data stored during said indexing stored reticles step includes said thickness determined in said measuring step.

41. The method of claim 37, wherein said processing step in the vacuum processing section comprises the step of cleaning the reticle.

42. The method of claim 37, wherein said processing step in the vacuum processing section comprises the step of rough-aligning the reticles with respect to a lithography tool.

43. The method of claim 37, wherein said processing step in the vacuum processing section comprises at least one of identifying, inspecting, measuring a thickness, cleaning, and rough-aligning each one of the reticles.

44. The method of claim 37, wherein said retrieving step comprises using a robot with multiple holding devices to retrieve the requested reticle.

45. The method of claim 44, wherein during said retrieving step more than one requested reticle is retrieved by the robot with the multiple holding devices to allow for exposure of more than one pattern on the wafer.

46. The method of claim 37, further comprising the step of transitioning the reticles from atmospheric pressure to vacuum in said input section.

47. The method of claim 37, further comprising the step of pre-aligning the requested reticle before performing said exposing.

48. The method of claim 37, wherein said indexing said stored reticles step comprises the step of storing data correlating information generated during at least one of said processing steps and a location of each one of the reticles stored in the vacuum library.

* * * * *